United States Patent
Jung et al.

(10) Patent No.: US 7,292,078 B2
(45) Date of Patent: Nov. 6, 2007

(54) PHASE LOCKED LOOP INTEGRATED CIRCUITS HAVING FAST LOCKING CHARACTERISTICS AND METHODS OF OPERATING SAME

(75) Inventors: Seok-Min Jung, Gyeonggi-do (KR); Ju-Hyung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 11/178,629

(22) Filed: Jul. 11, 2005

(65) Prior Publication Data
US 2006/0017476 A1    Jan. 26, 2006

(30) Foreign Application Priority Data
Jul. 22, 2004  (KR) .................... 10-2004-0057107

(51) Int. Cl.
*H03L 7/06*  (2006.01)
(52) U.S. Cl. ...................... 327/157; 327/148
(58) Field of Classification Search ............... None
See application file for complete search history.

(56) References Cited

U.S. PATENT DOCUMENTS

| | | | |
|---|---|---|---|
| 4,601,061 A * | 7/1986 | Carney et al. ............. 455/208 |
| 5,103,191 A | 4/1992 | Werker | |
| 5,339,021 A * | 8/1994 | Thomson .................... 323/354 |
| 5,424,689 A | 6/1995 | Gillig et al. | |
| 5,610,954 A * | 3/1997 | Miyashita et al. .......... 375/375 |
| 5,774,023 A | 6/1998 | Irwin | |
| 6,329,882 B1 | 12/2001 | Fayneh et al. | |
| 6,417,739 B1 | 7/2002 | Chacko | |
| 6,600,351 B2 * | 7/2003 | Bisanti et al. ............. 327/157 |
| 6,963,232 B2 * | 11/2005 | Frans et al. ................ 327/156 |
| 7,019,571 B2 * | 3/2006 | Lim ........................... 327/157 |
| 7,091,759 B2 * | 8/2006 | Sowlati et al. ............. 327/157 |
| 7,095,289 B2 * | 8/2006 | Knoll et al. ................ 331/185 |

FOREIGN PATENT DOCUMENTS

| | | |
|---|---|---|
| GB | 2 336 482 A | 10/1999 |
| JP | 10-098376 | 4/1998 |
| WO | WO 2004/075414 A1 | 9/2004 |
| WO | WO 2005/025069 A1 | 3/2005 |

OTHER PUBLICATIONS

Combined Search and Examination Report, GB Application No. 0515161.8, Aug. 26, 2005.
Notice to Submit Response, Korean Patent Application No. 10-2004-0057107, Apr. 28, 2006.

* cited by examiner

*Primary Examiner*—Cassandra Cox
(74) *Attorney, Agent, or Firm*—Myers Bigel Sibley & Sajovec PA (57) ABSTRACT

An integrated circuit device includes a fast-locking phase locked loop (PLL). This PLL includes a phase-frequency detector and first and second charge pumps, which are responsive to first and second control signals generated by the phase-frequency detector. The first and second charge pumps have different current sourcing characteristics when the first control signal is active and different current sinking characteristics when the second control signal is active.

11 Claims, 8 Drawing Sheets

PHASE LOCKED LOOP INTEGRATED CIRCUITS HAVING FAST LOCKING CHARACTERISTICS AND METHODS OF OPERATING SAME

REFERENCE TO PRIORITY APPLICATION

This application claims priority to Korean Patent Application No. 2004-57107, filed Jul. 22, 2004, the disclosures of which are hereby incorporated herein by reference.

FIELD OF THE INVENTION

The present invention relates to phase locked loop integrated circuits and methods of operating same.

BACKGROUND OF THE INVENTION

Figure 1:
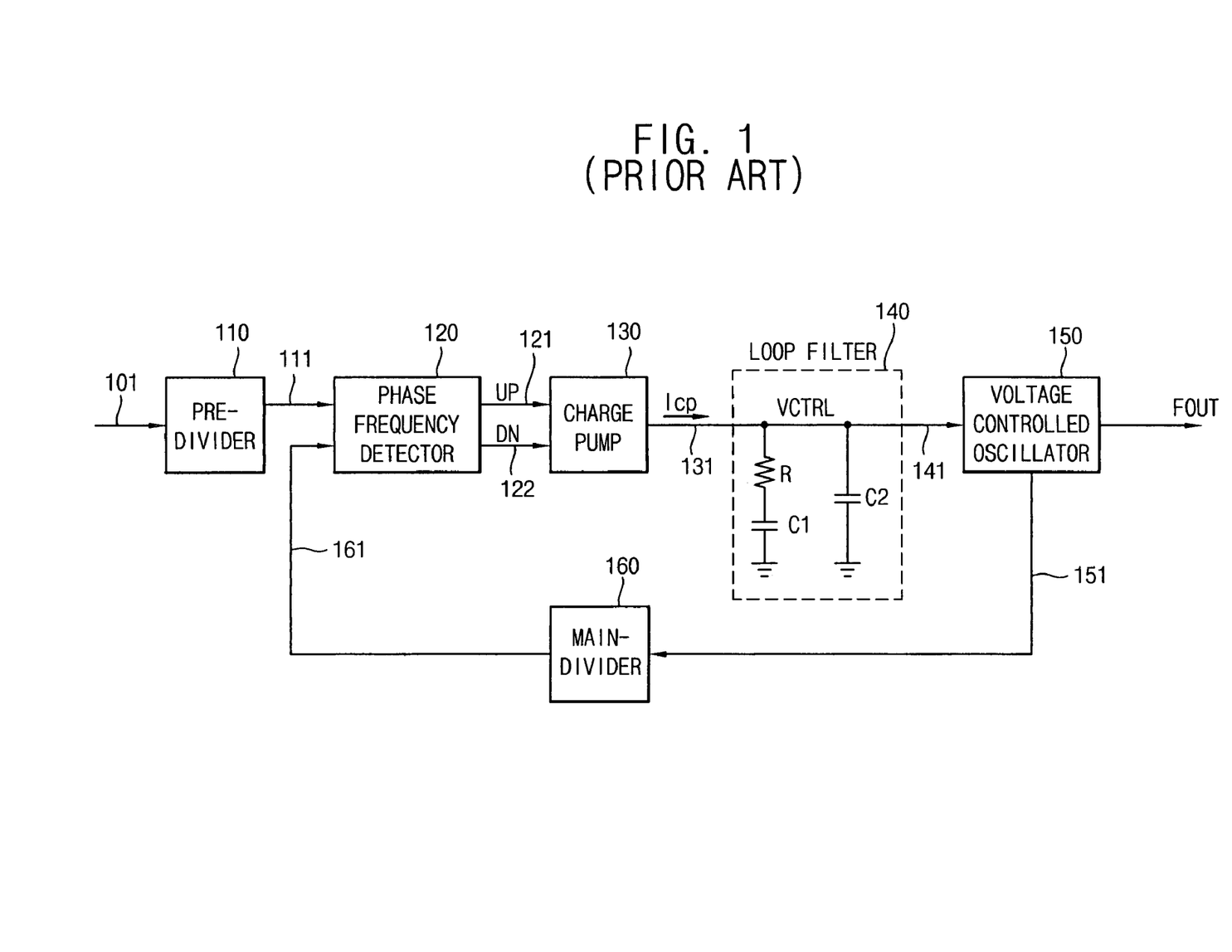
FIG. 1 is a block diagram illustrating a conventional charge pump PLL (Phase Locked Loop)

A PLL (Phase Locked Loop) is commonly used for communication, multimedia, and other applications. FIG. 1 is a block diagram illustrating a conventional charge pump PLL (Phase Locked Loop). An input clock 101 is inputted to a pre-divider 110 and the pre-divider 110 converts the input clock 101 to a lower frequency clock 111. The converted lower frequency clock 111 is provided to a phase frequency detector (PFD) 120. The phase frequency detector 120 compares a phase of the lower frequency clock 111 to a phase of a final clock 161 generated from a main-divider 160 and outputs an UP signal 121 and/or a DOWN signal 122. When the phase of the lower frequency clock 111 leads the phase of the final clock 161, the UP 121 signal is activated and the DOWN signal 122 is inactivated. Conversely, when the phase of the lower frequency clock 111 lags behind the phase of the final clock 161, the DOWN signal 122 is activated and the UP signal 121 is inactivated.

A charge pump 130 outputs a current (Icp) 131 to a loop filter 140 when the UP signal 121 is activated and pulls the current (Icp) 131 from the loop filter 140 when the DOWN signal 122 is activated. An output voltage 141 of the loop filter 140 increases when the phase frequency detector 120 outputs the UP signal 121 having an active state, and the output voltage 141 of the loop filter 140 decreases when the phase frequency detector 120 outputs the DOWN signal 122 having an active state. The loop filter 140 is illustrated as containing a resistor R and capacitors C1 and C2.

The output voltage 141 of the loop filter 140 is provided to a voltage-controlled oscillator (VCO) 150 and is used for controlling a frequency of an output clock 151. This output clock 151 may be the same signal as FOUT. The frequency of the output clock 151 outputted from the VCO 150 is generally proportional to an input voltage of the VCO 150 (i.e., the output voltage 141 of the loop filter 140). The output clock 151 of the VCO 150 is divided by the main-divider 160 and the divided output clock 161 is fed back to the phase frequency detector 120. The main-divider 160 may be optionally included in the charge pump PLL. In particular, the output clock 151 of the VCO 150 is divided by the main-divider 160 and the divided output clock 161 is provided to the phase frequency detector 120 when the PLL performs a function of frequency multiplication. In addition, the main-divider 160 and the pre-divider 110 can determine a frequency ratio of the output clock 161 to the input clock 101.

An important factor in defining the performance of the PLL is a 'locking time' that represents a time required for generating an output clock synchronized to an input clock and having a predetermined target frequency. Communication, multimedia, and other applications utilizing the PLL require a fast locking time.

Referring to the charge pump PLL shown in FIG. 1, the locking time may be re-defined as a time required for a control voltage 141 of the VCO 150 to reach a voltage level that is required to generate the predetermined target frequency. According to the conventional charge pump PLL shown in FIG. 1, the magnitude of the current (Icp) 131 outputted from the charge pump 130 during an initial stage of a phase lock operation is equal to the magnitude of the current (Icp) 131 outputted from the charge pump 130 during a stage in which the phase lock is almost completed. The locking time of the PLL is substantially inversely proportional to the quantity of the current (Icp) 131 outputted from the charge pump 130. However, when the quantity of the current (Icp) 131 outputted from the charge pump 130 is increased in order to reduce the locking time of the charge pump PLL, spectral purity (or reliability) of the PLL is degraded and noise of the output clock increases. That is, in a PLL employing single charge pump, there is often a trade-off between fast locking time and good reliability.

In order to solve these problems, a structure of a modified PLL is disclosed in Japan Patent No. 98376. The PLL of the Japan Patent No. 98376 includes a plurality of charge pump units and the PLL operates in two modes, i.e. a high-speed mode in which the charge pump units provide a large current and a low noise mode.

However, the PLL of the Japan Patent No. 98376 controls the switching between the two modes of the charge pump unit, which provides a large current in the high-speed mode, using a logic circuit. The PLL can't variably control the quantity of the current outputted from a charge pump based on a phase difference between an input clock and an output clock. Additionally, jitter of the output clock may be generated since a switching noise due to a switching of the charge pump unit for performing the high-speed mode is applied to a loop filter.

Another conventional charge pump PLL is disclosed in U.S. Pat. No. 5,424,689, which is entitled "Filtering device for use in a phase locked loop controller". The charge pump PLL of U.S. Pat. No. 5,424,689 includes two-type charge pumps, including of a high current charge pump for providing a large current and a small current charge pump for providing a small current. However, the current transfer of two charge pumps are controlled using a variable transmission characteristic of a loop filter based on a fact that the transmission characteristics of the loop filter depend upon connect points between each of the two charge pumps and the loop filter.

SUMMARY OF THE INVENTION

Integrated circuit devices according to embodiments of the invention include a phase locked loop (PLL). This PLL includes a phase-frequency detector and first and second charge pumps, which are each responsive to first and second control signals generated by the phase-frequency detector. The phase-frequency detector is responsive to first and second clock signals. The first and second charge pumps have different current sourcing characteristics when the first control signal is active and different current sinking characteristics when the second control signal is active. These different current sourcing characteristics support fast locking of the PLL. The PLL also includes a loop filter. This loop filter may have first and second input terminals and a voltage-controller oscillator electrically coupled to an output terminal of the loop filter. The first charge pump has an output electrically coupled to the first input terminal of the loop filter and the second charge pump has an output electrically coupled to the second input terminal of the loop filter.

According to preferred aspects of these embodiments, the current sourcing characteristics of the second charge pump dominate those of the first charge pump when a phase difference between the first and second clock signals is greater than a first threshold. This first threshold, which relates directly to a pulse width of the first control signal, is typically exceeded when the PLL is initially enabled and the pulse width of the first control signal is large. Alternatively, the current sourcing characteristics of the first charge pump dominate those of the second charge pump when the phase difference between the first and second clock signals is less than the first threshold. This condition is typically present when the PLL is near a lock condition between the first and second clock signals and the pulse width of the first control signal is relatively small.

DETAILED DESCRIPTION OF THE INVENTION

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Figure 2:
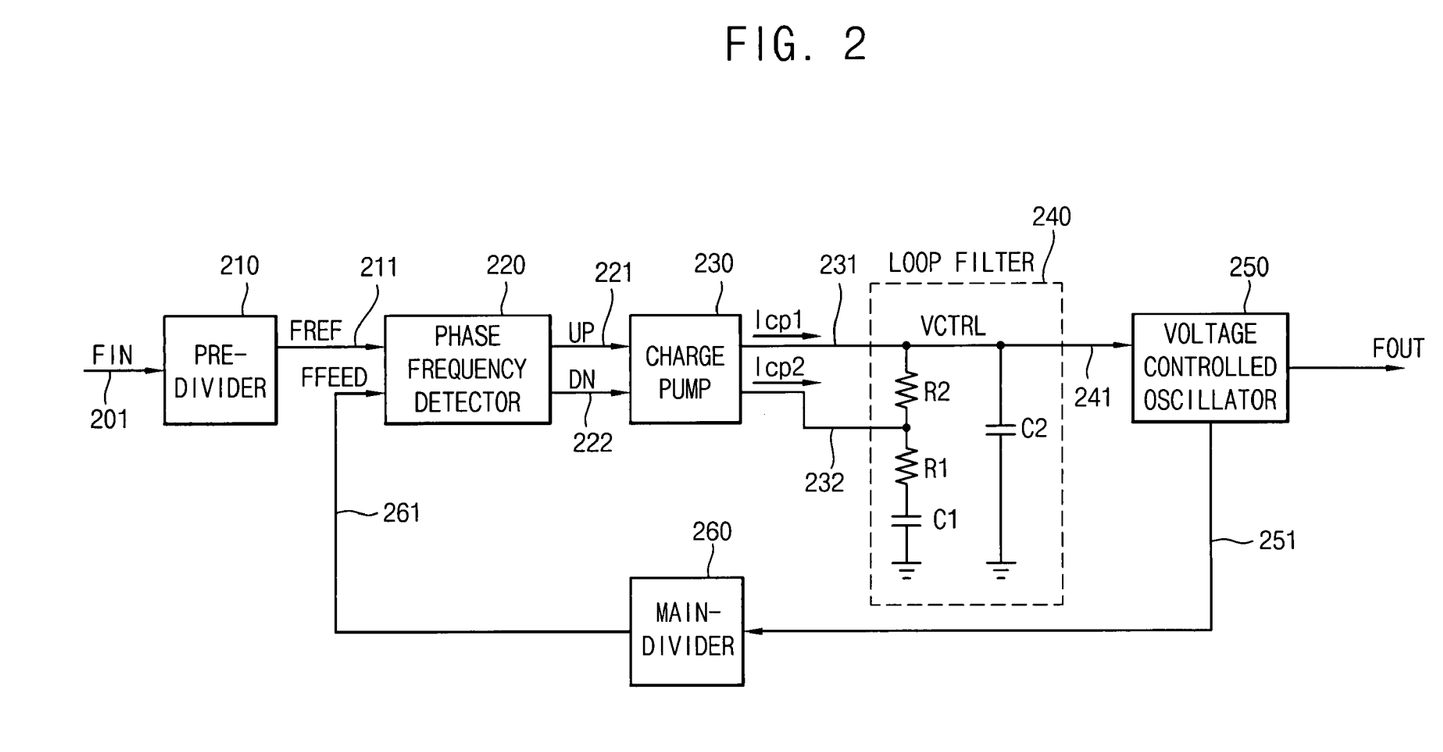
FIG. 2 is a block diagram illustrating a charge pump PLL (Phase Locked Loop) according to an example embodiment of the present invention.

FIG. 2 is a block diagram illustrating a charge pump PLL (Phase Locked Loop) according to an example embodiment of the present invention. An input clock (FIN) 201 is inputted to a pre-divider 210 and the pre-divider 210 converts the input clock 201 to a low frequency clock (FREF) 211. The low frequency clock 211 is provided to a phase frequency detector 220. The phase frequency detector 220 compares a phase of the low frequency clock 211 to a phase of a final clock (FFEED) 261 generated from a main-divider 260 and outputs an UP signal 221 and/or a DOWN signal 222. When the phase of the low frequency clock 211 leads the phase of the final clock 261, the UP 221 signal is activated and the DOWN signal 222 is inactivated. Conversely, when the phase of the low frequency clock 211 lags behind the phase of the final clock 261, the DOWN signal 222 is activated and the UP signal 221 is inactivated.

A charge pump 230 outputs currents to a loop filter 240 or pulls currents from the loop filter 240 through two paths 231 and 232. In particular, a current is outputted to the loop filter 240 through the first path 231 or is pulled from the loop filter 240 through the first path 231 based on the states of the UP signal 221 and the DOWN signal 222. In contrast, the second path 232 controls the quantity of the current, which is outputted to the loop filter 240 or pulled from the loop filter 240, in proportion to a phase difference between the input clock 211 and the output clock 261.

The loop filter includes resistors R1 and R2 and capacitors C1 and C2. The output voltage 241 of the loop filter 240 is provided to a voltage controlled oscillator (VCO) 250 and is used for controlling a frequency of an output clock 251, which may be equivalent to the signal FOUT. The output clock 251 of the VCO 250 is divided by the main-divider 260 and then the divided output clock 261 is fed back to the phase frequency detector 220. The inclusion of a main-divider 260 is optional.

Figure 3:
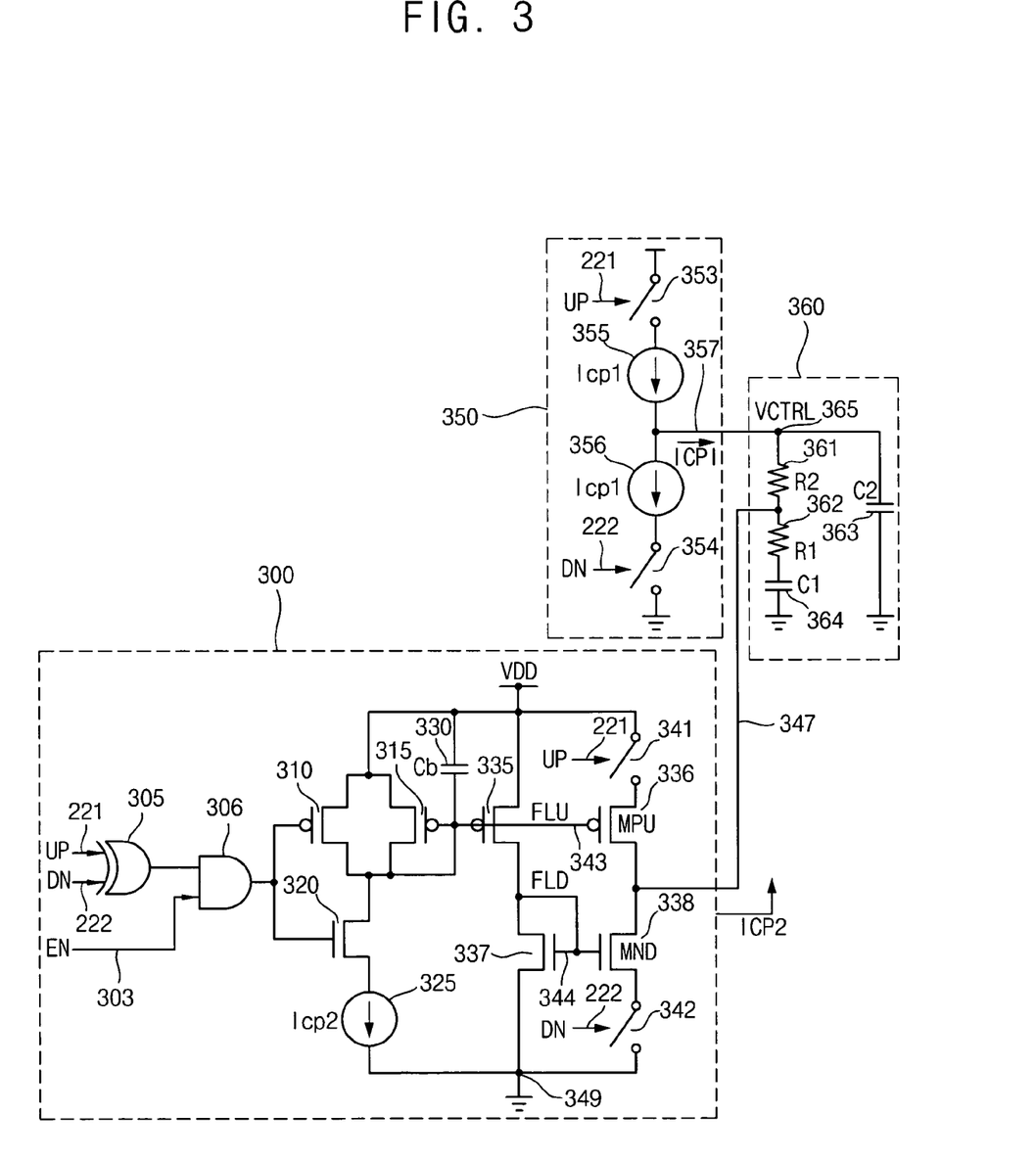
FIG. 3 is a circuit diagram illustrating first and second charge pumps and a loop filter included in a PLL (Phase Locked Loop) according to an example embodiment of the present invention.

FIG. 3 is a circuit diagram illustrating first and second charge pumps and a loop filter included in a fast locking charge pump PLL (Phase Locked Loop) according to an example embodiment of the present invention. The fast locking charge pump PLL shown in FIG. 3 according to an example embodiment of the present invention includes a first charge pump 350 and a second charge pump 300. The first charge pump 350 pushes (or pulls) a current provided from current sources 355 and 356 to/from the loop filter 360 via a first current path 357 using a first switch 353 and a second switch 354. The first switch 353 and the second switch 354 operate in response to the UP signal 221 and the DOWN signal 222 outputted from the phase frequency detector 220.

Features of the second charge pump 300 will now be described. An exclusive OR gate 305 included in the second charge pump 300 receives the UP signal 221 and the DOWN signal 222 outputted from the phase frequency detector 220, and the result of the logic operation and an enable signal (EN) 303 are provided to an AND gate 306. The enable signal (EN) 303 is used for determining whether the second charge pump 300 is enabled or not. The second charge pump 300 can operate based on the UP signal 221 and the DOWN signal 222 when the enable signal 303 is activated. When both of the UP signal 221 and the DOWN signal 222 are in an inactive state (e.g., a logic low level), the output of the AND gate 306 has an inactive state. When the UP signal 221 is in an active state and the DOWN signal 222 is in an inactive state or when the UP signal 221 is in an inactive state and the DOWN signal 222 is in an active state, the output of the AND gate 306 has an active state (e.g., a logic high level). In addition, because both the UP signal 221 and the DOWN signal 222 are in an active state during a reset operation of the phase frequency detector 210, the exclusive-OR gate 305 disregards this condition by providing a logic 0 signal to the AND gate 306.

A second current path 347 of the second charge pump 300 is coupled to serially coupled resistors 361 and 362 included in the loop filter 360. In alternative embodiments, the loop filter 360 may have various configurations depending upon filtering characteristics of the loop filter, however, in the illustrated embodiment of the present invention, the loop filter 360 includes a first capacitor 363 coupled between an output terminal 365 of the loop filter 360 and the ground, a second capacitor 364 serially coupled to the resistors 361 and 362 as shown in FIG. 3.

An operation of the second charge pump 300 is now described below with reference to FIGS. 3, 4A through 4D and 5A through 5C. FIGS. 4A through 4D show signal waveforms during an initial stage of phase lock according to an example embodiment of the present invention. In the initial stage of phase lock of FIG. 4A through 4D, the phase difference between the input clock and the output clock is typically very large. FIGS. 5A through 5C show signal waveforms during a last stage of phase lock according to an example embodiment of the present invention. In the last stage of phase lock of FIG. 5A through 5C, the phase difference between the input clock and the output clock is typically small.

The charge pump PLL according to an embodiment of the present invention adaptively operates based on a phase difference between an input clock and an output clock.

Figure 4A:
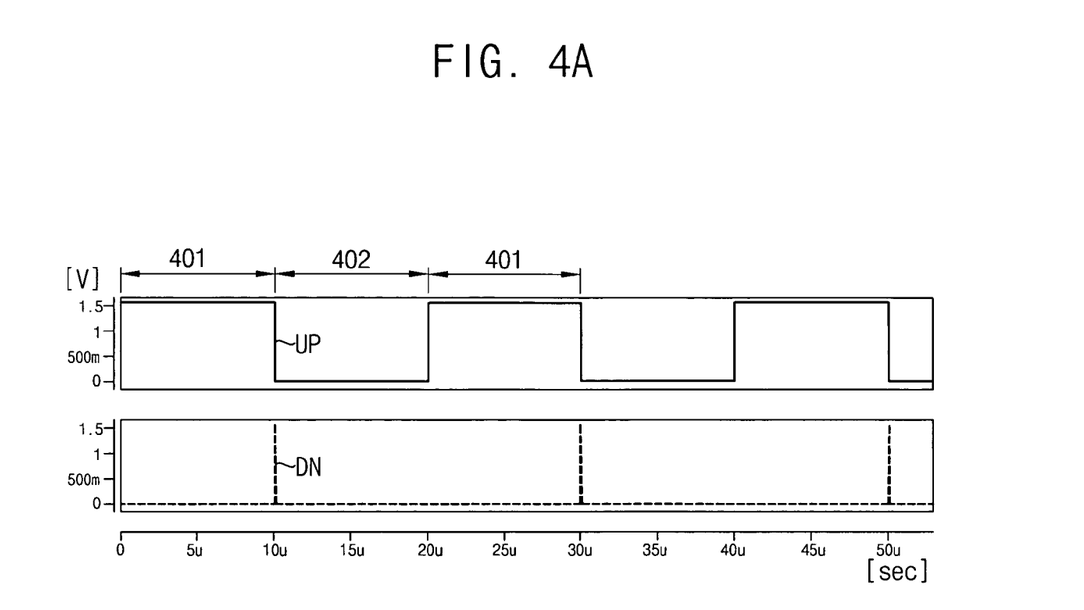
FIGS. 4A through 4D show signal waveforms during an initial stage of phase lock according to an example embodiment of the present invention.

With reference to FIGS. 4A through 4D, there is explained the first operation in the case where the phase difference of the input clock and the output clock is large during the initial stage of phase lock and, at the same time, a phase of the input clock leads a phase of the output clock. FIG. 4A is waveform showing the UP signal 221 and the DOWN signal 222 outputted from the phase frequency detector 220 in the above-mentioned condition. As shown in FIG. 4A, the UP signal in an active state has wide width and the DOWN signal is in an inactive state. The output of the AND gate 306 has an inactive state during a first section 402 where the UP signal is in an inactive state and the DOWN signal 222 has an inactive state. When this occurs, the PMOS transistor 310 is turned-on and a fast locking up voltage (hereinafter referred to as "FLU" voltage) 343 is pre-charged to a high power supply voltage VDD. The FLU voltage 343 is applied to a control electrode of a PMOS transistor 335 and then used for controlling the turn-on intensity of the PMOS transistor 335. In addition, a diode coupled NMOS transistor 337, which is serially coupled to the PMOS transistor 335, is controlled by a fast locking down voltage (hereinafter referred to as "FLD" voltage) 344. The FLD voltage 344 has a symmetrical waveform with respect to the waveform of the FLU voltage 343.

Figure 4B:
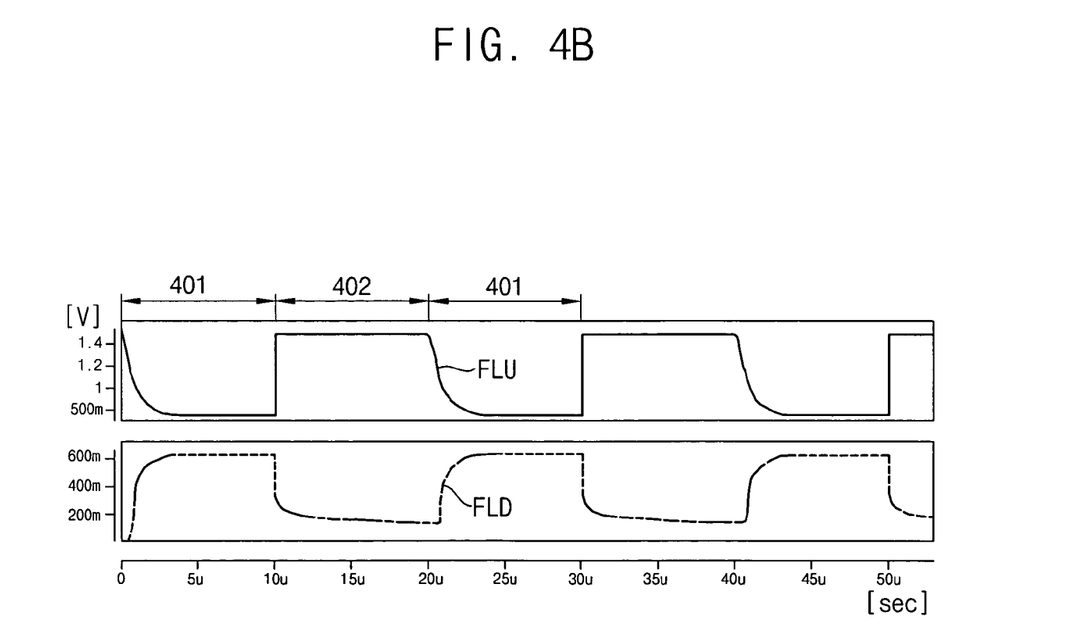
Figure 5A:
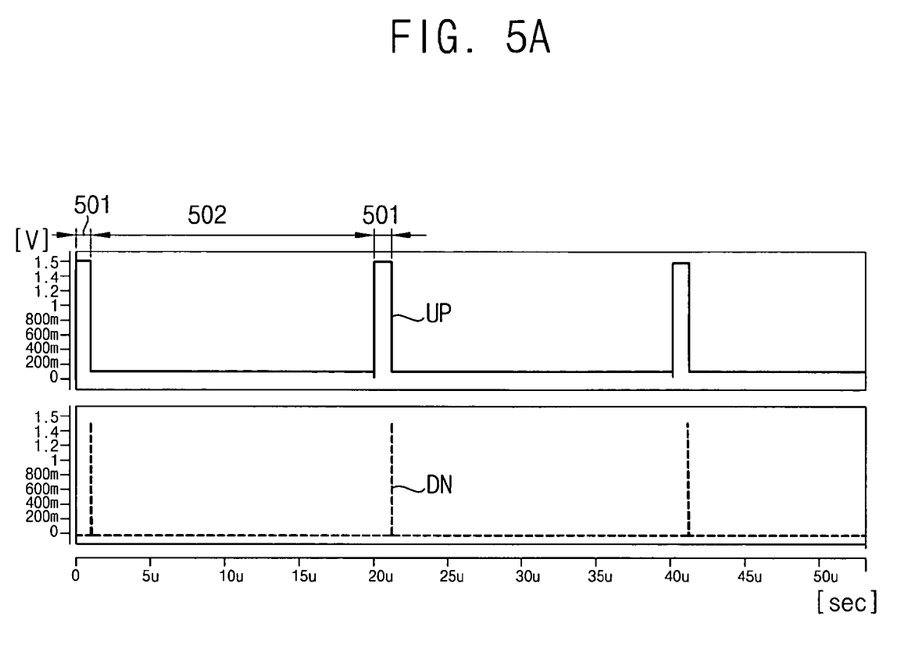
FIGS. 5A through 5C show signal waveforms during a last stage of the phase lock according to an example embodiment of the present invention.
Figure 5B:
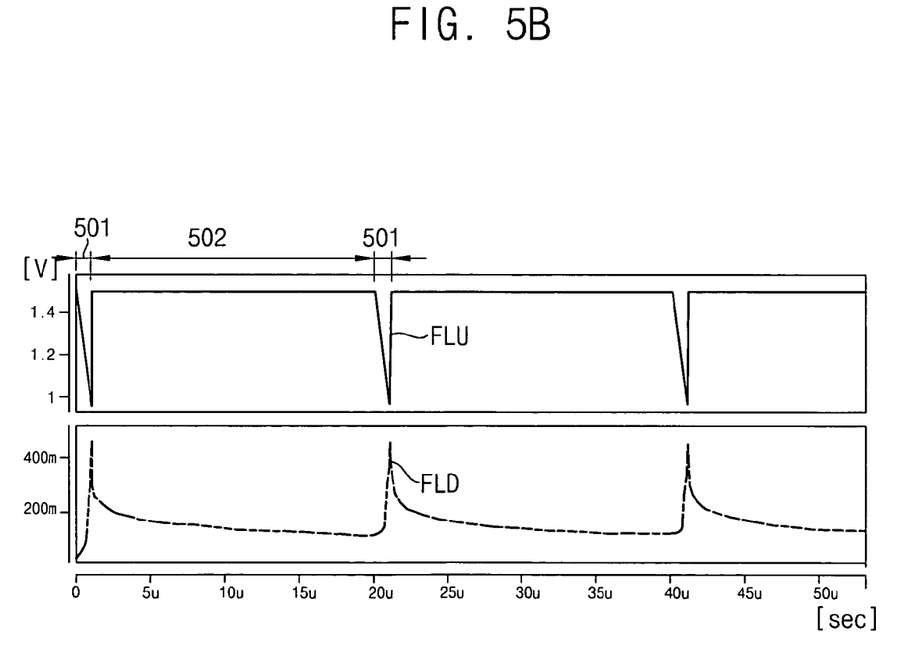
Figure 5C:
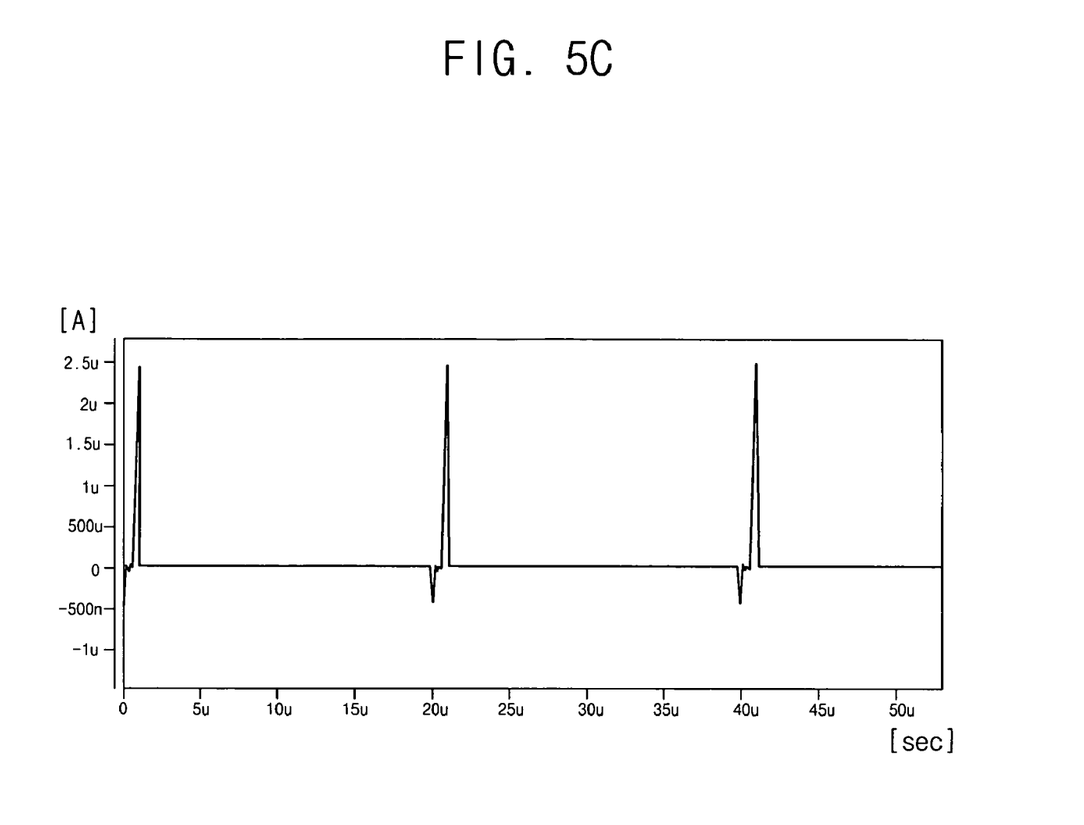

FIG. 4B illustrates waveforms showing variations of the FLU voltage 343 and the FLD voltage 344 according to a state transition of the UP signal 221. After the FLU voltage 343 is pre-charged to the high power supply voltage VDD in response to the inactive state of the UP signal 221, when the UP signal 221 goes to an active state (401) from an inactive state (402), a switch 341 is closed in response to the active state of the UP signal 221. Meanwhile, when the UP signal 221 goes to the active state (401), the output of the AND gate 306 goes to an active state. In response, the NMOS transistor 320 is turned-on. As a result, a predetermined current is provided through a current source 325 and a bias capacitor 330, and then the FLU voltage 343 decreases during the period 401. While the FLU voltage 343 decreases, a PMOS transistor 336 is turned-on. In response, a current is outputted from the high power supply voltage VDD to the loop filter 360 through the second current path 347.

Figure 4C:
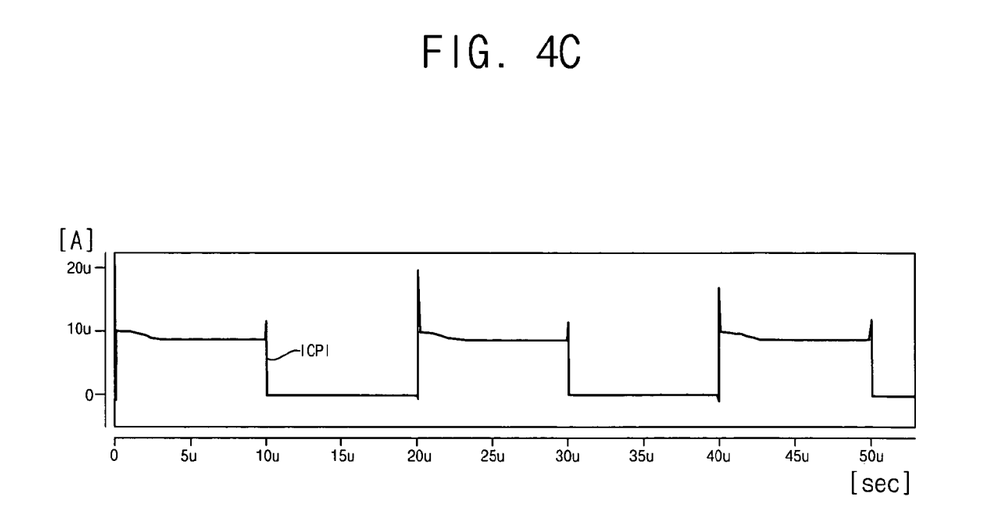
Figure 4D:
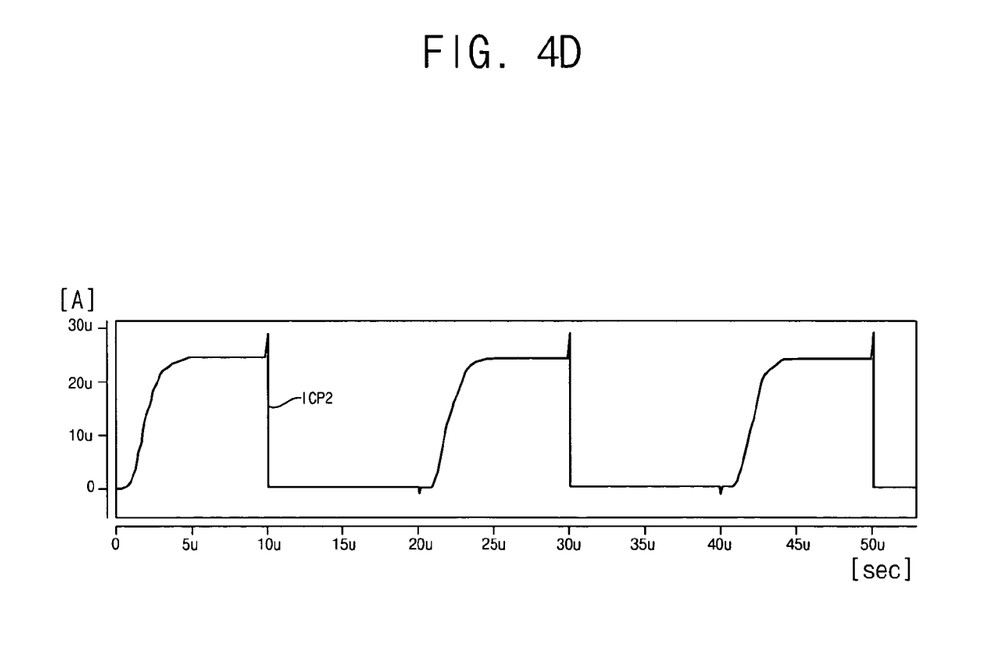

FIG. 4C is waveform showing a current ICP1 provided to the loop filter 360 from a current source 355 in the first charge pump 350 in response to the UP signal 221. FIG. 4D is waveform showing a current ICP2, which is controlled by the PMOS transistor 336 based on the FLU voltage 343 to be provided to the loop filter 360. The current ICP1 outputted from the first charge pump 350 shown in FIG. 4C and the current ICP2 outputted from the second charge pump 300 shown in FIG. 4D are provided to the loop filter 360 together. Generally, the second charge pump 300 outputs a relatively high current ICP2 compared with the current ICP1 outputted from the first current sources 355 and 356 of the first charge pump 350. Thus, the second charge pump 300 can reduce the locking time. In the example embodiments of the present invention, the current quantity of the second current source 325 included in the second charge pump 300 is about two to three times as large as the current quantity of the first current sources 355 and 356 included in the first charge pump 350.

There is now explained the second operation in case the phase difference between the input clock and the output clock is large during the initial stage of phase lock and, at the same time, a phase of the output clock leads a phase of the input clock. The second operation, in which the UP signal 221 is inactivated and the DOWN signal 222 is activated, may be easily understood with reference to the symmetrical relationship between the FLU voltage 343 and the FLD voltage 344 as shown in FIG. 4B. While the DOWN signal 222 is in an inactive state, the FLU voltage 343 is pre-charged to the high power supply voltage VDD and PMOS transistor 335 is off and the FLD voltage 344 goes to the ground voltage level. Conversely, while the DOWN signal 222 is in active state, the FLU voltage 343 decreases and a level of the FLD voltage 344 increases in symmetrical relationship with the FLU voltage 343. As the FLD voltage 344 increases, an NMOS transistor 338 is turned-on and then pulls a current from the loop filter 360 via the second current path 347. Because the first charge pump 350 and the second charge pump 300 pull a relatively large current from the loop filter 360, a voltage level of the output terminal 365 in the loop filter 360 rapidly decreases in a similar way as the case when a phase of the input clock leads a phase of the output clock.

Hereinafter, there is explained operations for the case where a phase difference of the input clock and the output clock is small during a last stage of phase lock with reference to FIGS. 5A through 5C. First, a third operation for the case where a phase of the input clock leads a phase of the output clock will be explained. FIG. 5A is waveform showing the UP signal 221 and the DOWN signal 222 outputted from the phase frequency detector 220 in the above-mentioned condition. As shown in FIG. 5A, the UP signal 221 in an active state has narrow width compared with the UP signal 221 shown in FIG. 4A, and the DOWN signal 222 is in an inactive state. During the period 502 while the UP signal is in an inactive state, an output of the AND gate 306 has an inactive state. Thus, the PMOS transistor 310 is turned-on and the FLU voltage 343 is pre-charged to the high power voltage VDD. The FLU voltage 343 is applied to a control electrode of a PMOS transistor 335, and then is used for controlling the turn-on intensity of the PMOS transistor 335.

In addition, a diode coupled NMOS transistor 337, which is serially coupled to the PMOS transistor 335, is controlled by the FLD voltage 344. The FLD voltage 344 has a symmetrical waveform with respect to the waveform of the FLU voltage 343 as shown in FIG. 5B.

FIG. 5B shows variations of the FLU voltage 343 and the FLD voltage 344 according to state transition of the UP signal 221. After the FLU voltage 343 is pre-charged to the high power supply voltage VDD in response to the inactive state of the UP signal 221, when the UP signal 221 goes to an active state from an inactive state, a switch 341 is closed in response to the UP signal 221.

Meanwhile, the output of the AND gate 306 goes to an active state when the UP signal 221 goes to an active state, and then an NMOS transistor 320 is turned-on. As a result, a current is provided through a current source 325 and a bias capacitor 330, and then the FLU voltage 343 decreases. While the FLU voltage 343 decreases, the PMOS transistor 336 remains turned-on. Thus, a current is outputted from the high power supply voltage VDD to the loop filter 360 through the second current path 347. However, the UP signal 221 is changed to an inactive state from an active state before the voltage level of the FLU voltage 343 completely drops. This is because the period 501 where the UP signal 221 is in an active state has a narrow width. Consequently, the PMOS transistor 336 is turned-off right after the PMOS transistor 336 is weakly turned-on.

FIG. 5C is waveform showing current quantity provided to the loop filter 360 from a second charge pump 300. As shown in FIG. 5C, the second charge pump 300 provides a relatively low level current to the loop filter 360 compared with the current provided from the second charge pump 300 shown in FIG. 4D

There is now explained a fourth operation for the case where a phase difference between the input clock and the output clock is small during a last stage of the phase lock and, at the same time, a phase of the output clock leads a phase of the input clock. The fourth operation may be easily understood with reference to the symmetrical relationship between the FLU voltage 343 and the FLD voltage 344 as shown in FIG. 5B. In the fourth operation, the UP signal 221 is inactivated and the DOWN signal 222 is activated. While the DOWN signal 222 is in an inactive state, the FLU voltage 343 is pre-charged to the high power supply voltage VDD, and the FLD voltage 344 is discharged to the ground voltage. Conversely, while the DOWN signal 222 is in active state, the FLU voltage 343 decreases since a current is provided through the current source 325 and the bias capacitor 330. As a result, a level of the FLD voltage 344 increases in symmetrical relationship with the FLU voltage 343. Accordingly, as the FLD voltage 344 increases, the NMOS transistor 338 is turned-on, and then a current is pulled from the loop filter 360 via the second current path 347. In such case, however, the DOWN signal 222 is changed to an inactive state from an inactive state before the FLD voltage 344 completely (or fully) rises since the period where the DOWN signal 222 is in an active state has a narrow width. Consequently, the NMOS transistor 338 is turned-off right after the NMOS transistor 338 is weakly turned-on. That is, the charge pump 300 pulls a relatively low current from the loop filter 360.

As described above, the second charge pump 300 can control the quantity of current that is provided to the loop filter or is provided from the loop filter by increasing or by decreasing the FLU voltage 343 and the FLD voltage 344 based on the pulse width of the UP signal 221 and the DOWN signal 222 and the bias capacitor 330.

Figure 6A:
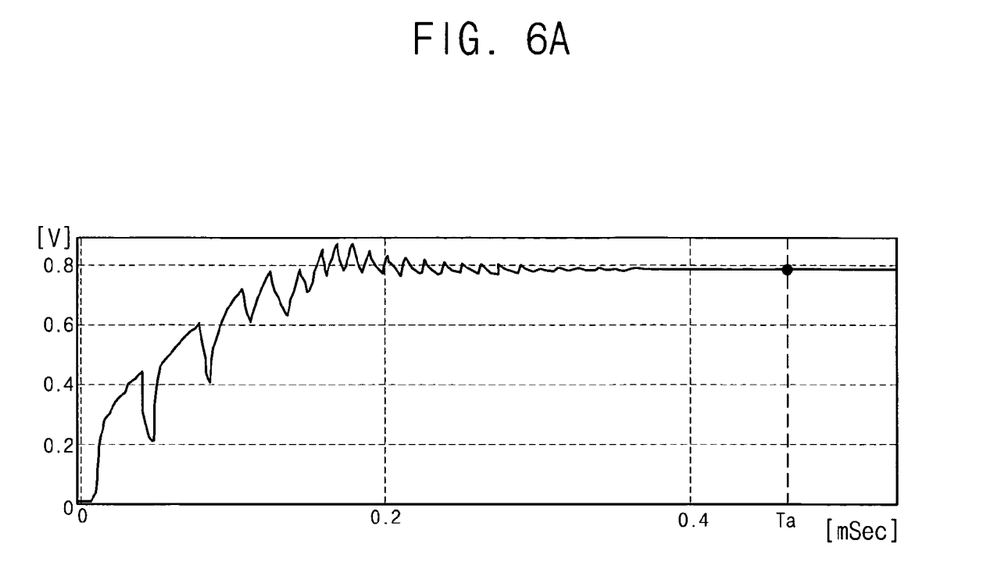
FIGS. 6A through 6B show simulation waveforms of an output voltage of a loop filter according to an example embodiment of the present invention.
Figure 6B:
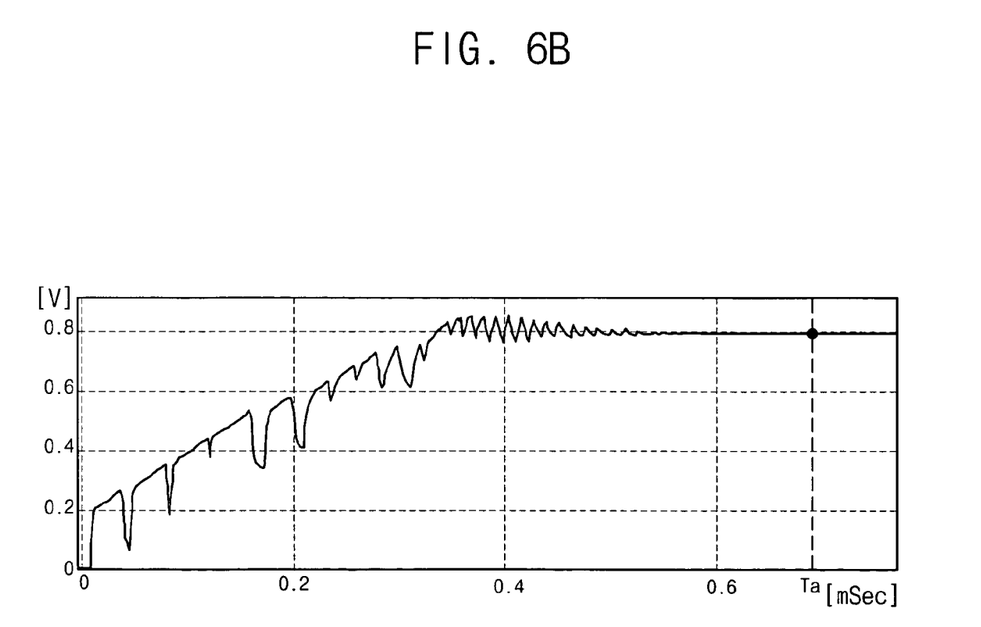

In order to suitably control the quantity of the current, the threshold voltages of the current switching elements PMOS transistor 336 and the NMOS transistor 338 included in the second charge pump 300 may be adjusted. For example, the threshold voltage of the PMOS transistor 336 may be set to a value ((VDD−VSS)×⅔+VSS). VDD denotes a high power voltage, and VSS denotes a low power voltage. VSS may have a negative voltage or a ground level. The threshold voltage of the NMOS transistor 338 may be set to a value ((VDD−VSS)×⅓+VSS). FIGS. 6A and 6B show waveforms of an output voltage of a loop filter according to an example embodiment of the present invention. In detail, FIGS. 6A and 6B show a voltage-time graph that indicates improved locking time of the fast locking charge pump PLL according to an example embodiment of the present invention. As mentioned above, the locking time may be defined as a time required before a control voltage of the VCO 150 is maintained at a fixed voltage level.

FIG. 6A is a simulation waveform showing a locking time measured while the enable signal EN is activated. FIG. 6B is a simulation waveform showing a locking time measure while the enable signal EN is inactivated. As shown in FIGS. 6A and 6B, in order to generate a predetermined target frequency, the control voltage of the VCO is set to the level of about 0.78 volts. As shown in FIG. 6A, the measured locking time Ta is about 463 milliseconds, and as shown in FIG. 6B, the measured locking time is about 688 milliseconds.

Therefore, the proposed fast locking charge pump PLL according to embodiments of the present invention can reduce the locking time up to about 32.7% in comparison with the locking time of the conventional charge pump PLL.

According to the example embodiments of the present invention, the quantity of the current outputted from the charge pump is controlled based on the phase difference between the phase of the input clock and the phase of the output clock. In an initial stage of the phase lock, a large current is provided to the loop filter or is provided from the loop filter. In a last stage of the phase lock, a small current is provided to the loop filter or is provided from the loop filter. Thus, the locking time may be reduced.

While the example embodiments of the present invention and their advantages have been described in detail, it should be understood that various changes, substitutions and alterations may be made herein without departing from the scope of the invention.

What is claimed is:

1. An integrated circuit device, comprising:
    a phase locked loop integrated circuit comprising a phase-frequency detector and first and second charge pumps responsive to first and second control signals generated by the phase-frequency detector, said first and second charge pumps having different current sourcing characteristics when the first control signal is active and different current sinking characteristics when the second control signal is active;
    wherein the phase-frequency detector is responsive to first and second clock signals;
    wherein the current sourcing characteristics of the second charge pump dominate those of the first charge pump when a phase difference between the first and second clock signals is greater than a first threshold;
    wherein the current sourcing characteristics of the first charge pump dominate those of the second charge pump when the phase difference between the first and second clock signals is less than the first threshold; and
    wherein the current sourcing characteristics of the second charge pump dominate those of the first charge pump when the first and second charge pumps are simultaneously active.

2. The device of claim 1, wherein the phase locked loop integrated circuit further comprises a loop filter having first and second input terminals and a voltage-controlled oscillator electrically coupled to an output terminal of the loop filter; wherein the first charge pump has an output electrically coupled to the first input terminal of the loop filter; and wherein the second charge pump has an output electrically coupled to the second input terminal of the loop filter.

3. The device of claim 2, wherein the first charge pump is configured to supply current to the first input terminal when the first control signal is active and withdraw current from the first input terminal when the second control signal is active; and wherein the second charge pump is configured to supply current to the second input terminal when the first control signal is active and withdraw current from the second input terminal when the second control signal is active.

4. The device of claim 1, wherein the first and second control signals are UP and DOWN control signals.

5. The device of claim 2, wherein the loop filter comprises a resistor; and wherein the first and second input terminals of the loop filter are connected to opposite ends of the resistor.

6. A Phase Locked Loop (PLL) comprising:
a phase frequency detector configured to generate an UP signal and a DOWN signal based on a phase difference between an input clock and an output clock;
a first charge pump configured to output or pull a first current based on the UP signal and the DOWN signal;
a second charge pump configured to output or pull a second current variably controlled based on the UP signal and the DOWN signal;
a loop filter configured to receive a current provided from the first charge pump and the second charge pump, or configured to output a current to the first charge pump and the second charge pump, said loop filter comprising at least one capacitor coupled between a low power voltage and an output terminal and a plurality of resistors serially coupled to the at least one capacitor, one end of one of the resistors being capacitively coupled to the low power voltage; and
a voltage controlled oscillator configured to generate a predetermined target frequency based on an output voltage provided from the loop filters;
wherein an output of the first charge pump is coupled to the output terminal of the loop filter, and an output of the second charge pump is coupled to a connect point between a first resistor and a second resistor serially coupled to the at least one capacitor.

7. The PLL of claim 6, wherein the phase frequency detector generates the UP signal or the DOWN signal of which pulse widths in an active state is wide and of which pulse width in an inactive state is narrow when a phase difference between the input clock and the output clock is large, and the phase frequency detector generates the UP signal or the DOWN signal of which pulse width in an active state is narrow and of which pulse widths in an inactive state is wide when the phase difference between the input clock and the output clock is small, and wherein the UP signal and a state of the DOWN signal are maintained alternatively in inactive states.

8. The PLL of claim 6, wherein the second charge pump increases a quantity of the second current provided to the loop filter according as a first period, during which the UP signal, which is maintained at an active state, increases, and the second charge pump increases a quantity of the second current pulled from the loop filter according as a second period, during which the DOWN signal, which is maintained at an active state, increases.

9. A phase locked loop (PLL) integrated circuit, comprising:
a phase frequency detector configured to generate an UP signal and a DOWN signal based on a phase difference between an input clock and an output clock;
a first charge pump configured to output or pull a first current based on the UP signal and the DOWN signal;
a second charge pump configured to output or pull a second current variably controlled based on the UP signal and the DOWN signal;
a loop filter configured to receive a current provided from the first charge pump and the second charge pump, or configured to output a current to the first charge pump and the second charge pump; and
a voltage controlled oscillator configured to generate a predetermined target frequency based on an output voltage provided from the loop filter
wherein the second charge pump increases a quantity of the second current provided to the loop filter according as a first period, during which the UP signal, which is maintained at an active state, increases, and the second charge pump increases a quantity of the second current pulled from the loop filter according as a second period, during which the DOWN signal, which is maintained at an active state, increases; and
wherein the second charge pump comprises:
at least one capacitor configured to be discharged when the UP signal and the DOWN signal are inactivated and configured to be charged when one of the UP signal and the DOWN signal is activated;
a first switching element configured to provide the loop filter with a first current controlled by a first control voltage coupled to one end of the capacitor;
a second switching element configured to pull a second current controlled by a second control voltage from the loop filter, the second control voltage being in symmetrical relationship with the first control voltage;
a third switching element, coupled to the high power voltage and the first switching element, configured to operate in response to the UP signal; and
a fourth switching element, coupled to the low power voltage and the second switching element, configured to operate in response to the DOWN signal.

10. The PLL of claim 9, wherein the second control voltage controls control electrodes of a first MOS transistor and a second diode-coupled MOS transistor, the first MOS transistor having a first current electrode coupled to the high power voltage, the second diode-coupled MOS transistor serially coupled to a second current electrode of the first MOS transistor and the low power voltage, and the second diode-coupled MOS transistor operating complementary to the first MOS transistor.

11. A charge pumping method of a Phase Locked Loop (PLL), the method comprising:
outputting an UP signal and a DOWN signal based on a phase difference between an input clock and an output clock;
providing a first current or pulling a second current based on the UP signal and the DOWN signal;
providing a third current or pulling a fourth current, the third and fourth current being variably controlled based on the UP signal and the DOWN signal;
varying an output voltage based on the first and the second currents; and
generating a predetermined target frequency based on the output voltage;
wherein the providing a first current or pulling a second current comprises:

increasing a quantity of the first current according as a first period in which the UP signal is maintained at an active state; and increasing a quantity of the second current according as a second period in which the DOWN signal is maintained at an active state;

wherein the quantity of the first current is increased using a first control voltage of a capacitor, the capacitor being discharged when the UP signal and the DOWN signal are in an inactive state and being charged when the UP signal is in an active state, and wherein the quantity of the second current is increased using a second control voltage of the capacitor, the capacitor being discharged when the UP signal and the DOWN signal is in the inactive state and being charged when the DOWN signal is in the active state.

* * * * *